United States Patent
Yang et al.

(10) Patent No.: US 7,649,732 B2
(45) Date of Patent: Jan. 19, 2010

(54) STRAP HOLDING STRUCTURE

(75) Inventors: Gang Yang, Shenzhen (CN); Hsiao-Hua Tu, Taipei Hsien (TW); Jun Wang, Shenzhen (CN); Peng-Jin Ge, Shenzhen (CN); Yong-Hui Sun, Shenzhen (CN)

(73) Assignees: Shenzhen Futaihong Precision Industry Co., Ltd., ShenZhen, Guangdong Province (CN); FIH (Hong Kong) Limited, Kowloon (HK)

( * ) Notice: Subject to any disclaimer, the term of this patent is extended or adjusted under 35 U.S.C. 154(b) by 289 days.

(21) Appl. No.: 11/614,420

(22) Filed: Dec. 21, 2006

(65) Prior Publication Data
US 2008/0060169 A1 Mar. 13, 2008

(30) Foreign Application Priority Data
Aug. 25, 2006 (CN) ............................ 200610062293

(51) Int. Cl.
*H05K 5/00* (2006.01)
(52) U.S. Cl. ................................ 361/679.01
(58) Field of Classification Search ................ 361/683, 361/679, 679.01, 679.55
See application file for complete search history.

(56) References Cited
U.S. PATENT DOCUMENTS
5,805,474 A * 9/1998 Danielson et al. ...... 361/679.56

* cited by examiner

Primary Examiner—Javaid Nasri
(74) Attorney, Agent, or Firm—Steven M. Reiss

(57) ABSTRACT

A strap holding structure (200) for an electronic device (100) includes a body (10), a strap holder (22) and a latching element (24). The body defines a receiving portion (12). The receiving porting has a side board (1242). The side board with the receiving portion cooperatively surrounds a space (1244). The strap holder has a pole (228) at one end thereof and two opposite feet (223) extending from another end thereof. A block (226) radially extends from a circumferential wall of the strap holder, and the side board is received in the space. The latching element forms two concave portions (244). Each foot engages with a corresponding concave portion. A stopper (246) perpendicularly protrudes from the latching element, and resists a wall of the receiving portion.

20 Claims, 5 Drawing Sheets

STRAP HOLDING STRUCTURE

BACKGROUND OF THE INVENTION

1. Field of the Invention

The present invention relates to strap holding structures and, particularly, to a strap holding structure for compact electronic devices such as portable telephones, portable computers, and so on.

2. Discussion of the Related Art

Compact electronic devices, such as portable telephones, internet wireless communicators, CD players, MP3 music players, mini electronic games, etc., have become more and more popular.

In a typical structure of holding electronic devices, it is inconvenient and uncomfortable for users to put these compact electronic devices into their pockets or hang them on their belts. Another conventional structure for holding electronic devices is a holder (i.e., an eyelet or the like) positioned in an electronic device so that a strap may be tied to the holder and hung around the neck. The holder generally includes a pole and a concave portion. The pole is positioned above the concave portion so as to provide a space to pass through the strap. A predetermined molding hole is necessary to form another end of the holder in order to form the pole of the holder. Owing to the existence of the molding hole, dust may easily enter into the electronic device. In order to solve this problem, an extra metal piece needs to be placed at one side of the holder to enclose the molding hole, thereby preventing dust getting into the electronic device. However, the metal piece is not easy to attach to the holder. In addition, this holder needs a screw to attach to the electronic device. Owing to the screw being positioned outside of the electronic device, the screw will affect the appearance of the electronic device.

Therefore, a simple and convenient holding structure to carry a decorative strap on a compact electronic device is desired in order to overcome the above-described problems.

SUMMARY

One embodiment of the strap holding structure for an electronic device includes a body, a strap holder and a latching element. The body defines a receiving portion. The receiving porting has a side board. The side board with the receiving portion cooperatively surrounds a space. The strap holder has a pole at one end thereof and two opposite feet extending from another end thereof. A block radially extends from a circumferential wall of the strap holder, and the strap holder is received in the receiving portion and the block is received in the space of the body to prevent movement of the strap holder relative to the body along an axis of the strap holder. The latch element forms two concave portions. Each foot engages with a corresponding concave portion. A stopper perpendicularly protrudes from the latching element, and resists a wall of the receiving portion to prevent rotation of the strap holder relative to the body about the axis of the strap holder.

Other advantages and novel features of the present strap holding structure will become more apparent from the following detailed description when taken in conjunction with the accompanying drawings.

BRIEF DESCRIPTION OF THE DRAWING

The components in the drawings are not necessarily drawn to scale, the emphasis instead being placed upon clearly illustrating the principles of the present strap holding structure. Moreover, in the drawings, like reference numerals designate corresponding parts.

DETAILED DESCRIPTION OF THE EMBODIMENT

Figure 1:
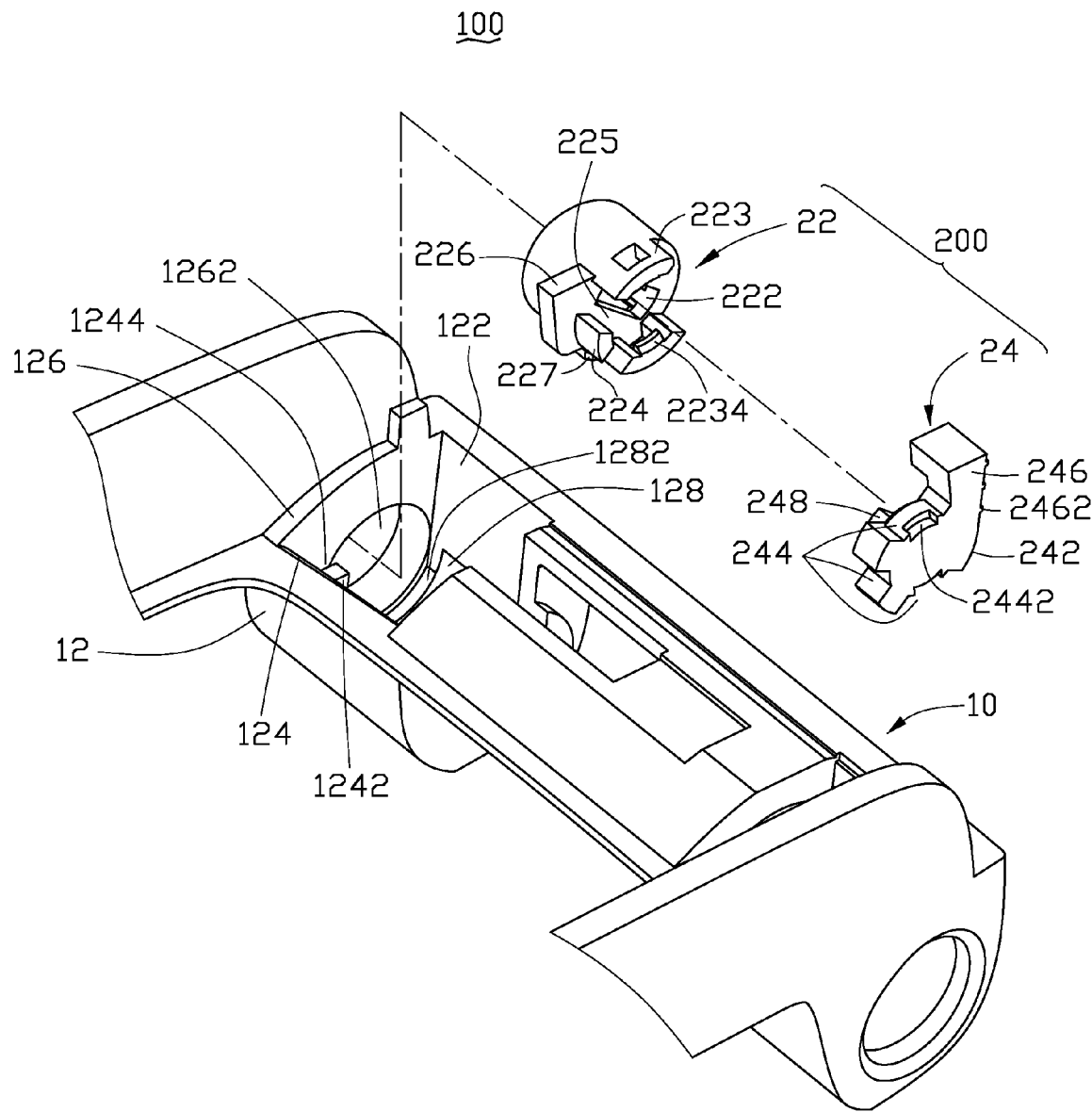
FIG. 1 is an exploded, isometric view of one embodiment of the strap holding structure.

Referring now to the drawings in detail, FIG. 1 shows a strap holding structure for an electronic device such as a mobile phone in accordance with one embodiment of the present invention. In an exemplary application, the strap holding structure is incorporated in a mobile phone 100.

Referring to FIG. 1, the mobile phone 100 includes a body 10 and a strap holding structure 200. The strap holding structure 200 may be attached to the body 10. The strap holding structure 200 includes a strap holder 22 and a latching element 24.

Figure 2:
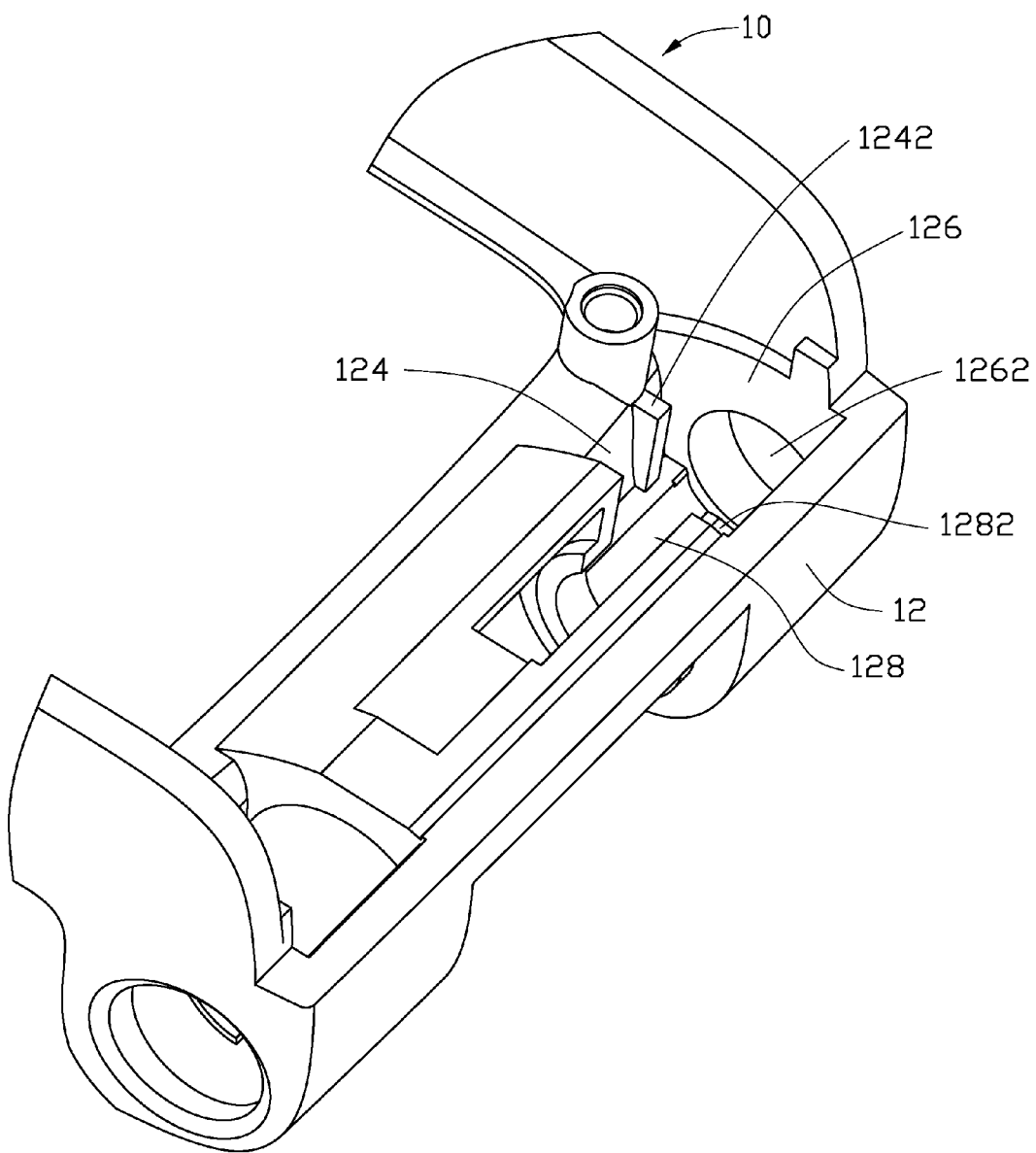
FIG. 2 is an isometric view of the body of the strap holding structure of FIG. 1 from another view.

Referring also to FIG. 2, the body 10 is a part of a housing of the mobile phone 100. The body 10 defines a receiving portion 12 for receiving the strap holding structure 200. The receiving portion 12 is substantially a semicircular hollow cylinder with an open side. The receiving portion 12 is cooperatively surrounded by a front wall 122, a back wall 124, a sidewall 126 and a bottom wall 128. The back wall 124 has a side board 1242 formed thereon. The side board 1242 with the sidewall 126 cooperatively defines a space 1244. The sidewall 126 defines a through hole 1262. The through hole 1262 communicates with the receiving portion 12. The bottom wall 128 defines an arcuate groove 1282 adjacent to the sidewall 126.

Figure 3:
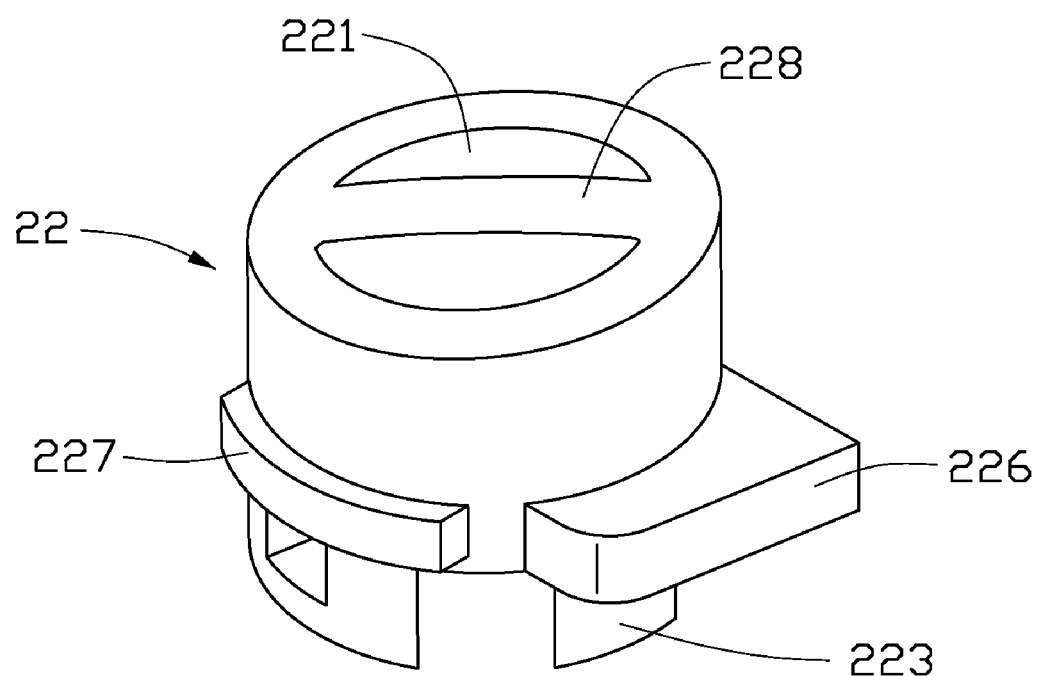
FIG. 3 is an enlarged, isometric view of the strap holding structure of FIG. 1.

Referring to FIG. 3, the strap holder 22 is substantially a hollow cylinder. One end of the strap holder 22 defines a recess 221. A pole 228 is positioned on the recess 221. The pole 228 and the recess 221 are integrally molded together. The other end of the strap holder 22 defines a rectangular opening 222. The opening 222 communicates with the recess 221. Two opposite situate feet 223 perpendicularly extend from a bottom periphery of the strap holder 22 at the end with the opening 222. A projection 224 is positioned between two feet 223. The strap holder 22 has a block 226 perpendicularly extending from a circumferential wall thereof and interconnecting with the projection 224. Adjacent to the block 226, an arcuate flange 227 is formed on the circumferential wall of the strap holder 22, and is coplanar with the block 226. Each foot 223 radially extends a wedge 2234 inwards front a distal end thereof.

Figure 4:
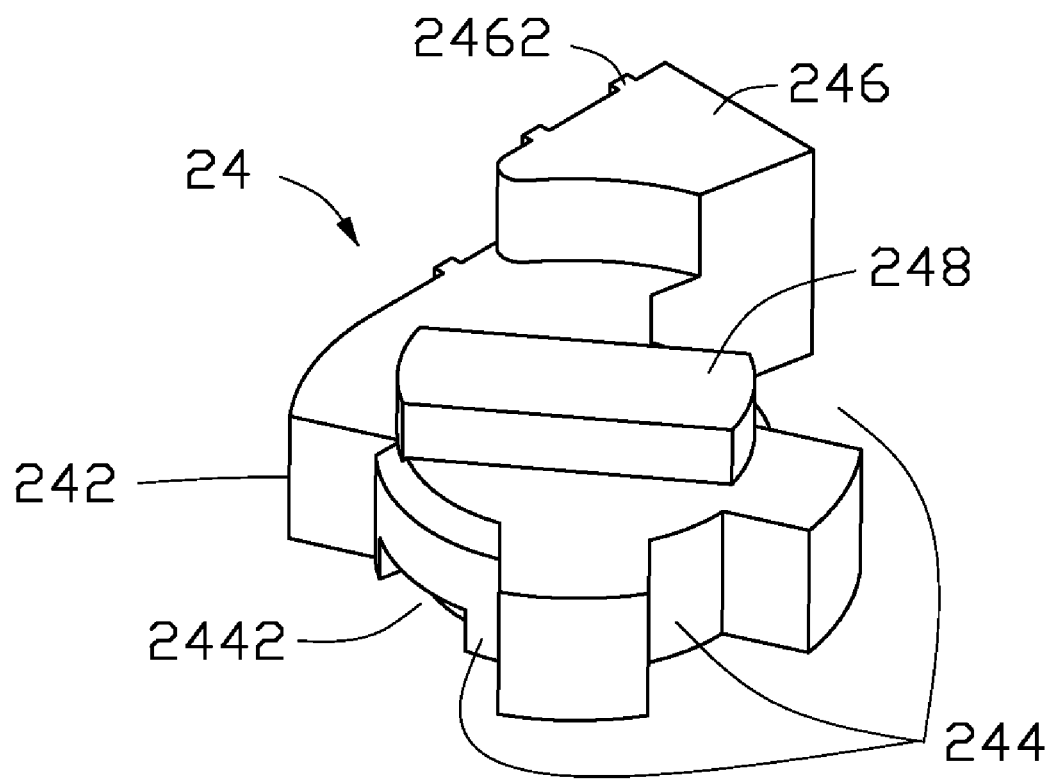
FIG. 4 is an enlarged, isometric view of the latching element of FIG. 1.

Referring to FIG. 4, the latching element 24 is an irregular cylinder. The latching element 24 has a latching wall 242. The latching wall 242 forms three concave portions 244. Two of the concave portions 244 are larger than another of the concave portion 244. The larger concave portions 244 respectively receive a given foot 223 of the strap holder 22. The smaller concave portion 244 receives the projection 224 of the strap holder 22. Each larger concave portion 244 defines a gap 2442. Each gap 2442 corresponds to a wedge 2234 of the strap holder 22. A stopper portion 246 perpendicularly protrudes from one side of the latching element 24 adjacent to a concave portion 244. A plurality of ribs 2462 are arranged in parallel on the latching wall 242 opposite to the concave portions 244. A rectangular portion 246 perpendicularly extends from one side of the latching element 24 at a substantially central area thereof.

Figure 5:
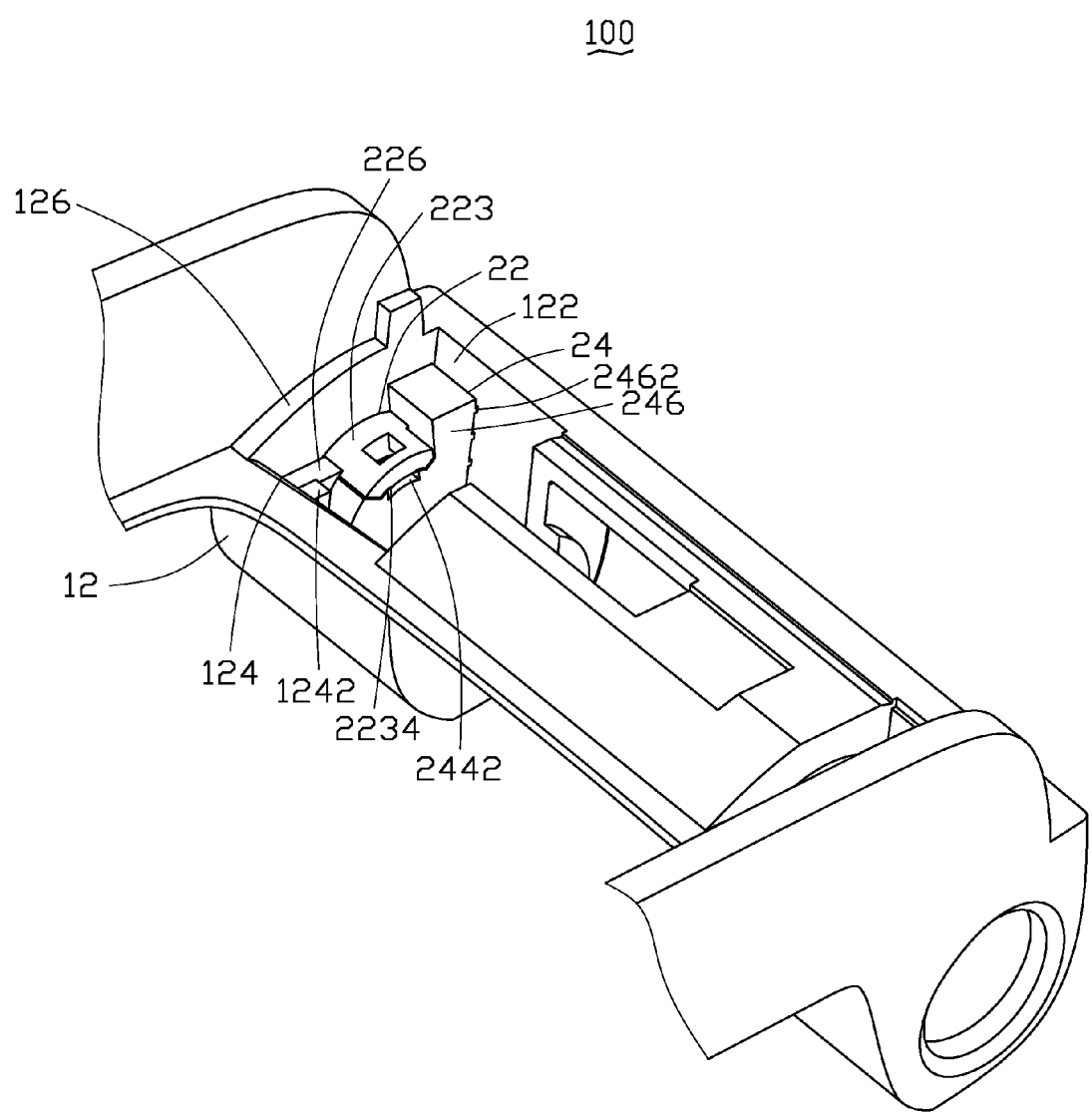
FIG. 5 is an assembled view of the strap holding structure shown in FIG. 1.

In assembly, referring to FIG. 5, the strap holder 22 is placed into the receiving portion 12 of the body 10 of the mobile phone 100. The pole 228 of the strap holder 22 is oriented perpendicular to the through hole 1262 of the body 10, and is inserted into the through hole 1262 until the block 226 resists the sidewall 126 of the body 10. Then, the strap holder 22 is rotated so that the flange 227 is received in the arcuate groove 1282 and the block 226 is received in the space 1244 of the body 10. The side board 1242 may limit the axial movement of the strap holder 22. The latching element 24 is then lowered into the receiving portion 12 of the body 10, and the rectangular portion 248 is aligned with the opening 222 of the strap holder 22 so that the stopper 248 is pushed into the opening 222 and encloses the opening 222 of the strap holder 22. At the same time, the feet 223 are received into the two larger concave portions 244, each wedge 2234 engaging with a corresponding gap 2442. The projection 224 is engaged in the smaller concave portion 244. The stopper portion 246 is kept in a corner between the front wall 122 and the sidewall 126 of the receiving portion 12. The ribs 2462 of the latching element 24 resist the front wall 122.

In use, when the strap holder 22 has an axial force exerted on it, the strap holder 22 cannot move axially owing to the block 226 being pressed between the sidewall 126 and the side board 1242. When the strap holder 22 has a radial torsion exerted on it, the strap holder 22 cannot rotate relative to the body 10 owing to the stopper portion 246 resisting the front wall 122. A strap may be tied to the pole 228 of the strap holder 22, and is hung to a neck of an user. The strap holding structure is simple and convenient to carry an electronic device. In addition, a decorative strap also may be tied to the electronic device so as to ornament the electronic device.

As described above, the strap holding structure 200 is configured for assembling to an electronic device. A main advantage of the strap holding structure 200 is that the structure depends on its own structure to attach to the electronic device, and does not need a screw to attach the strap holder. This structure is very simple, and does not affect the appearance of the electronic device. In addition, the strap holding structure 200 may enclose the opening 222 of the strap holder 22. Therefore, the structure prevents dust entering into the electronic device.

The above-described strap holding structure 200 can be used with other kinds of mini electronic devices besides the mobile phone 100 illustrated, or with other kinds of apparatuses that need a strap holding structure.

It is believed that the present embodiment and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A strap holding structure for an electronic device comprising:
    a body defining a receiving portion, the receiving porting having a side board, the side board cooperatively surrounding a space with the receiving portion;
    a strap holder having a pole at a first end of the strap holder, two opposite feet extending from an opposite second end of the strap holder, and a block radially extending from a circumferential wall thereof, wherein the strap holder is received in the receiving portion and the block is received in the space of the body to prevent movement of the strap holder relative to the body along an axis of the strap holder; and
    a latching element forming two concave portions, each of said two opposite feet engaging with a corresponding concave portion, a stopper perpendicularly protruding from one side of the latching element adjacent to one of the concave portion, the stopper resisting a wall of the receiving portion to prevent rotation of the strap holder relative to the body about the axis of the strap holder.

2. The strap holding structure as claimed in claim 1, wherein each of said two opposite feet of the strap holder radially extends a wedge toward inside from a distal end thereof, each of said two concave portions defines a gap, and each said wedge of the strap holder is received in a corresponding gap.

3. The strap holding structure as claimed in claim 2, wherein the second end of the strap holder defines an opening, and a rectangular portion extends from a central area of one side of the latching element, the rectangular portion is received in the opening of the strap holder.

4. The strap holding structure as claimed in claim 1, wherein a projection is positioned between said two opposite feet and interconnects with the block, and another concave portion is formed between two concave portions, and the projection is received in said another concave portion.

5. The strap holding structure as claimed in claim 1, wherein an arcuate flange is formed on the circumferential wall of the strap holder adjacent to the block, and is coplanar with the block, the receiving portion defines an arcuate groove, and the flange is engaged in the groove of the receiving portion.

6. The strap holding structure as claimed in claim 1, wherein a plurality of ribs are arranged on a wall of the latching element opposite to the concave portions, and the ribs are parallel to the axis of the strap holder and resist a wall of the receiving portion.

7. The strap holding structure as claimed in claim 1, wherein the block is integrally formed with the strap holder.

8. An electronic device comprising:
    a body defining a receiving portion;
    a strap holder received in the receiving portion and having a pole at one end thereof, two opposite feet extending from another end thereof, a block radially extending from a circumferential wall; and
    a latching element forming two concave portions, each of said two opposite feet engaging with a corresponding concave portion, a stopper perpendicularly protruding from one side of the latching element adjacent to one of the concave portion the concave portion, the stopper resisting a wall of the receiving portion.

9. The electronic device as claimed in claim 8, wherein the receiving portion is cooperatively surrounded by a front wall, a back wall, a sidewall and a bottom wall, the receiving portion has a side board extending therein and being spaced from the sidewall to form a space therebetween, and the block is received in the space of the body.

10. The electronic device as claimed in claim 9, wherein the stopper resists the sidewall and the front wall of the receiving portion.

11. The electronic device as claimed in claim 8, wherein each of said two opposite feet of the strap holder radially extends a wedge inwards from a distal end thereof, each of said two concave portions defines a gap, and each said wedge of the strap holder is received in a corresponding gap.

12. The electronic device as claimed in claim 11, wherein the strap holder comprises a second end, the second end of the strap holder defines an opening, and a rectangular portion extends from a central area of one side of the latching element, the rectangular portion is received in the opening of the strap holder.

13. The electronic device as claimed in claim 8, wherein a projection is positioned between said two opposite feet and connects with the block, and another concave portion is funned between said two concave portions, and the projection is received said another concave portion.

14. The electronic device as claimed in claim 8, wherein an arcuate flange is formed on the circumferential wall of the strap holder adjacent to the block, and is coplanar with the block, the receiving portion defines an arcuate groove, and the flange is engaged in the groove of the receiving portion.

15. The electronic device as claimed in claim 8, wherein a plurality of ribs are arranged in parallel on a wall of the latching element opposite to the concave portions, and the ribs resist a wall of the receiving portion.

16. The electronic device as claimed in claim 8, wherein the block is integrally formed with the strap holder.

17. An electronic device comprising:
   a body defining a receiving portion having a sidewall positioned at one side of the receiving portion, the side wall defining a through hole, a side board extending inward from the receiving portion and spaced from the sidewall;
   a strap holder received in the receiving portion, the strap holder comprising a first end and an apposite second end, aperture being defined through the first and the second ends, a pole crossing the aperture being formed at the first end which extends trough the trough hole of the sidewall of the body to expose the pole to outside of the body so that a strap is capable of being tied thereto, a block extending from the strap holder and being sandwiched between the sidewall and the side board to prevent the strap holder linearly sliding in the receiving portion; and
   a latching element secured to the second end of the strap holder to cover the aperture at the second end, a stopper protruding from one side of the latching element and resisting against a wall of the receiving portion to prevent the latching element and the strap holder rotating in the receiving portion.

18. The electronic device as claimed in claim 17, wherein the latching element forms two concave portions, the strap holder comprises two feet extending from the second end thereof, and each of said two feet is capable of being received in a corresponding concave portion.

19. The electronic device as claimed in claim 18, wherein each of said two feet of the strap holder extends a wedge inwards therefrom, each of said concave portions defines a gap, and each said wedge of the strap holder is engaged in a corresponding gap.

20. The electronic device as claimed in claim 18, wherein a plurality of ribs perpendicular to the sidewall is formed on the stopper of the latching element, and the ribs resist against the wall of the receiving portion.

\* \* \* \* \*

UNITED STATES PATENT AND TRADEMARK OFFICE
CERTIFICATE OF CORRECTION

PATENT NO. : 7,649,732 B2
APPLICATION NO. : 11/614420
DATED : January 19, 2010
INVENTOR(S) : Yang et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 318 days.

Signed and Sealed this

Twenty-third Day of November, 2010

David J. Kappos
*Director of the United States Patent and Trademark Office*